United States Patent [19]

Braden

[11] 4,381,321
[45] Apr. 26, 1983

[54] METHOD OF PROCESSING MINIATURE ELECTRONIC COMPONENTS SUCH AS CAPACITORS OR RESISTORS

[75] Inventor: Denver Braden, Carlsbad, Calif.

[73] Assignee: Palomar Systems & Machines, Inc., Escondido, Calif.

[21] Appl. No.: 313,950

[22] Filed: Oct. 22, 1981

Related U.S. Application Data

[63] Continuation-in-part of Ser. No. 123,201, Feb. 21, 1980.

[51] Int. Cl.³ .............................................. B05D 5/00
[52] U.S. Cl. ........................................ 427/79; 427/58; 427/101; 427/102; 427/282; 427/284
[58] Field of Search .................. 427/79, 58, 282, 284, 427/101, 102; 118/500, 503

[56] References Cited

U.S. PATENT DOCUMENTS

| | | | |
|---|---|---|---|
| 2,366,886 | 1/1945 | Van Tuyl | 414/417 |
| 2,386,076 | 10/1945 | Taylor et al. | 414/417 |
| 2,961,900 | 11/1960 | Stanton | 269/227 |
| 3,007,440 | 11/1961 | Naven et al. | 118/503 |
| 4,064,606 | 12/1977 | Dunn | 427/79 |

FOREIGN PATENT DOCUMENTS

| | | | |
|---|---|---|---|
| 2421264 | 11/1975 | Fed. Rep. of Germany | 427/79 |
| 340556 | 8/1959 | Switzerland | 427/79 |

*Primary Examiner*—John D. Smith
*Assistant Examiner*—Richard Bueker
*Attorney, Agent, or Firm*—Oliver D. Olson

[57] ABSTRACT

Miniature electronic component parts such as capacitors or resistors are end conductively coated by use of a part handling plate having a multiplicity of passageways therethrough with walls coated by resilient material to grip the parts. A bank of pins in a press (a) are used to move the parts in the passageways, (b) are used to load the parts into the passageways through the use of a loading plate housing part receiving openings filled with parts by the use of vibration equipment, and (c) are used to discharge the parts from the passageways into the recesses of an unloading plate. The parts are moved in the passageways first to expose one end to be coated and then second to expose the other end of the parts to be coated.

10 Claims, 17 Drawing Figures

METHOD OF PROCESSING MINIATURE ELECTRONIC COMPONENTS SUCH AS CAPACITORS OR RESISTORS

The present application is a continuation-in-part of my prior, copending application, Ser. No. 06/123,201, filed 2/21/80, entitled "Means and Method for Processing Miniature Electronic Components such as Capacitors or Resistors," Art Unit 314.

BRIEF SUMMARY OF THE INVENTION AND OBJECTIVES

My invention relates to a method of processing miniature capacitors or the like useful in applying a conductive coating to the ends thereof. The claims of this application include a method of coating ends of miniature electronic parts classified in Class 427, subclass 284, according to the Office Action of 8/6/80 in Ser. No. 123,201, requiring restriction and labeling such claims as Group I claims.

A preliminary examination search was made on the invention which resulted in the citing of the following patents by the searcher: U.S. Pat. Nos. 4,131,982, 4,089,105, 3,963,456, 3,785,035, 3,710,479, 3,727,284, 3,896,654, 3,851,223, 3,896,451.
I was not familiar with the specific devices shown in these patents. I do not believe the patents show the inventions claimed herein.

In processing such miniature components, the following features are desirable to be achieved, among others:
   (a) To process parts economically in terms of time and cost, i.e., to process parts in batches of hundreds in each operation.
   (b) To produce as few defective parts as is feasible and to readily detect defects.
   (c) To utilize relatively, economical, low maintenance, easily operated, long life equipment.

It is an object of my invention to provide a method to process such components having the above features. Time saving is a primary advantage of my method and equipment.

My invention will be best understood, together with additional objectives and advantages thereof, from the following description, read with reference to the drawings, in which:

DETAILED DESCRIPTION

Figures 6, 8, 9, 10:
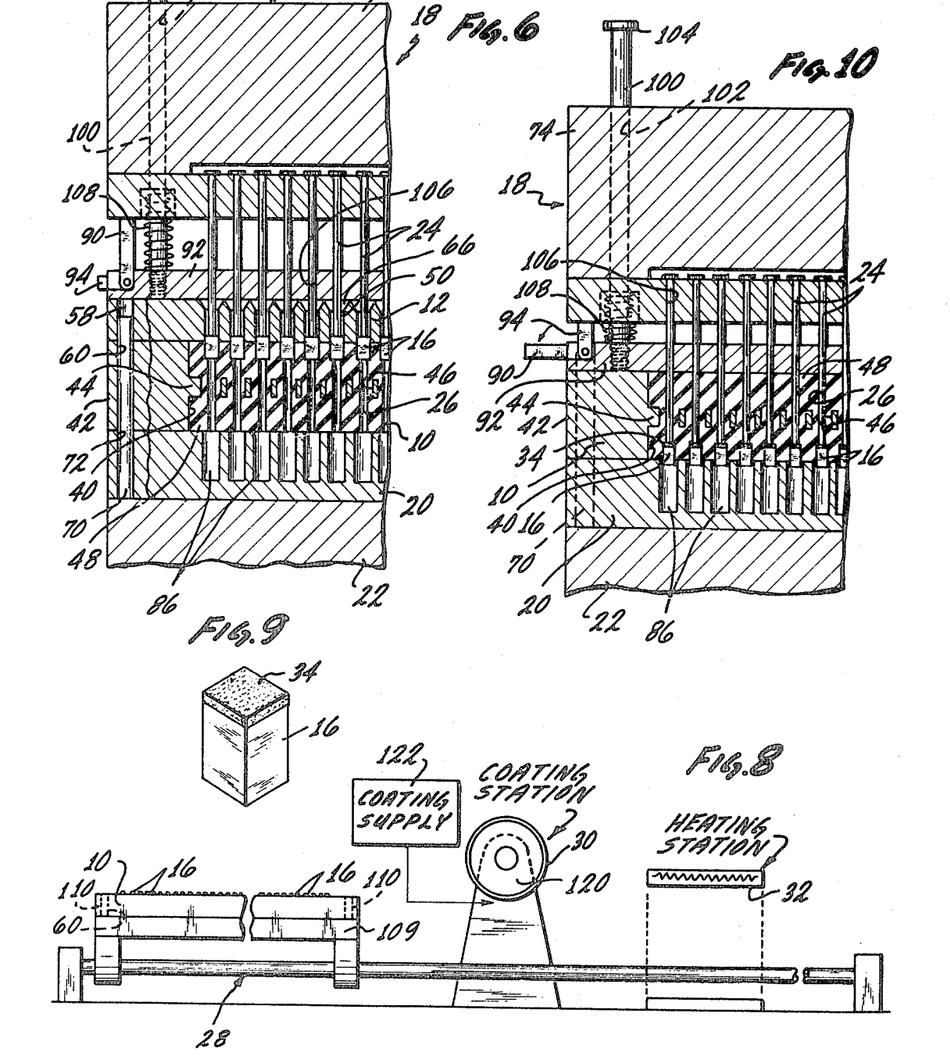
FIG. 6 is a view like FIG. 5 but with some parts in different positions.
FIG. 8 is an elevational schematical representation of some processing equipment.
FIG. 9 is an enlarged perspective view of en electronic component with a coating on one end.
FIG. 10 is a view like FIGS. 5 and 6 with some parts in different positions.
Figure 14:
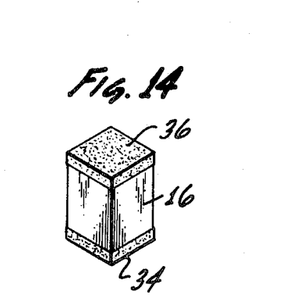
FIG. 14 is like FIG. 9 but showing a coating on both ends of the electronic components.

The purpose of the processing and equipment is to conduct certain operations on parts, especially to apply to the ends of a miniature electronic component 16, in sequence, coatings 34, 36. FIG. 9 shows the part with coating 34 and FIG. 14 shows the addition of coating 36.

Part 16 could be a chip capacitor or a resistor for example. In size, an example would be around 1/16×1/16" in cross-section and 3/32 to 5/32" long but the part could be larger or smaller than that. The construction of such a miniature capacitor or resistor will be understood by those skilled in the art. A capacitor, for example, has a sizable number of conductive layers separated by non-conductive layers. Conductive layers are interfingered as to electrical connection of layers to opposite ends of part 16. In any case, such miniature part 16 needs to have conductive coatings applied to opposite ends and my invention concerns that operation.

Figure 1:
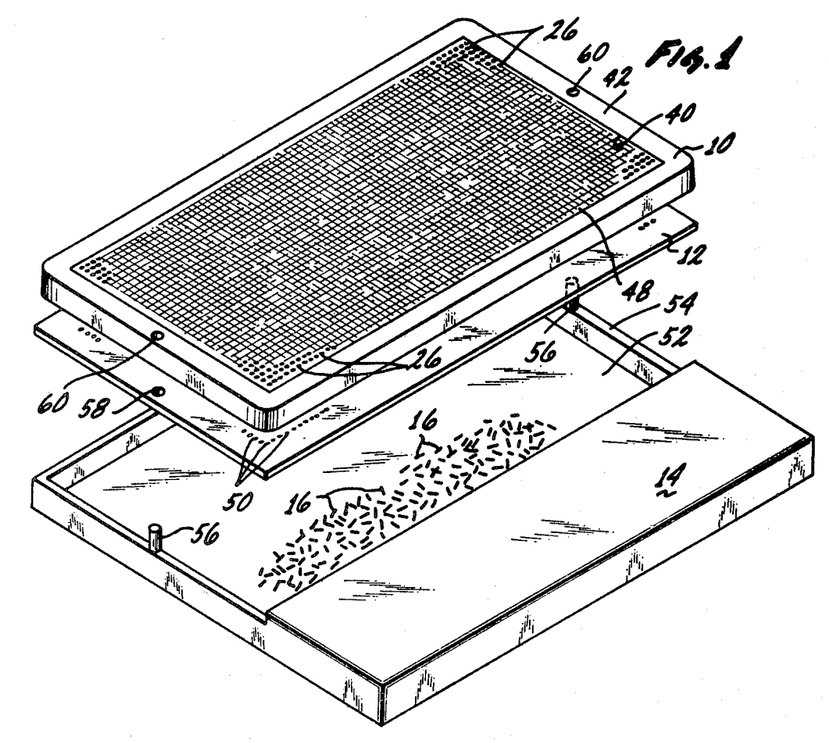
FIG. 1 is an exploded perspective view of a specific embodiment of some of the equipment used in my invention.
Figure 2:
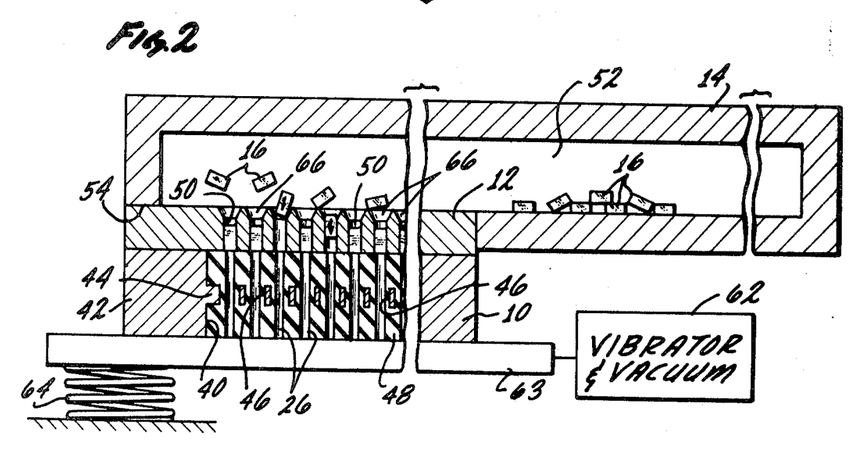
FIG. 2 is a fragmentary vertical sectional view, on enlarged scale, showing partly the same equipment as FIG. 1.
Figures 3, 4, 5, 7:
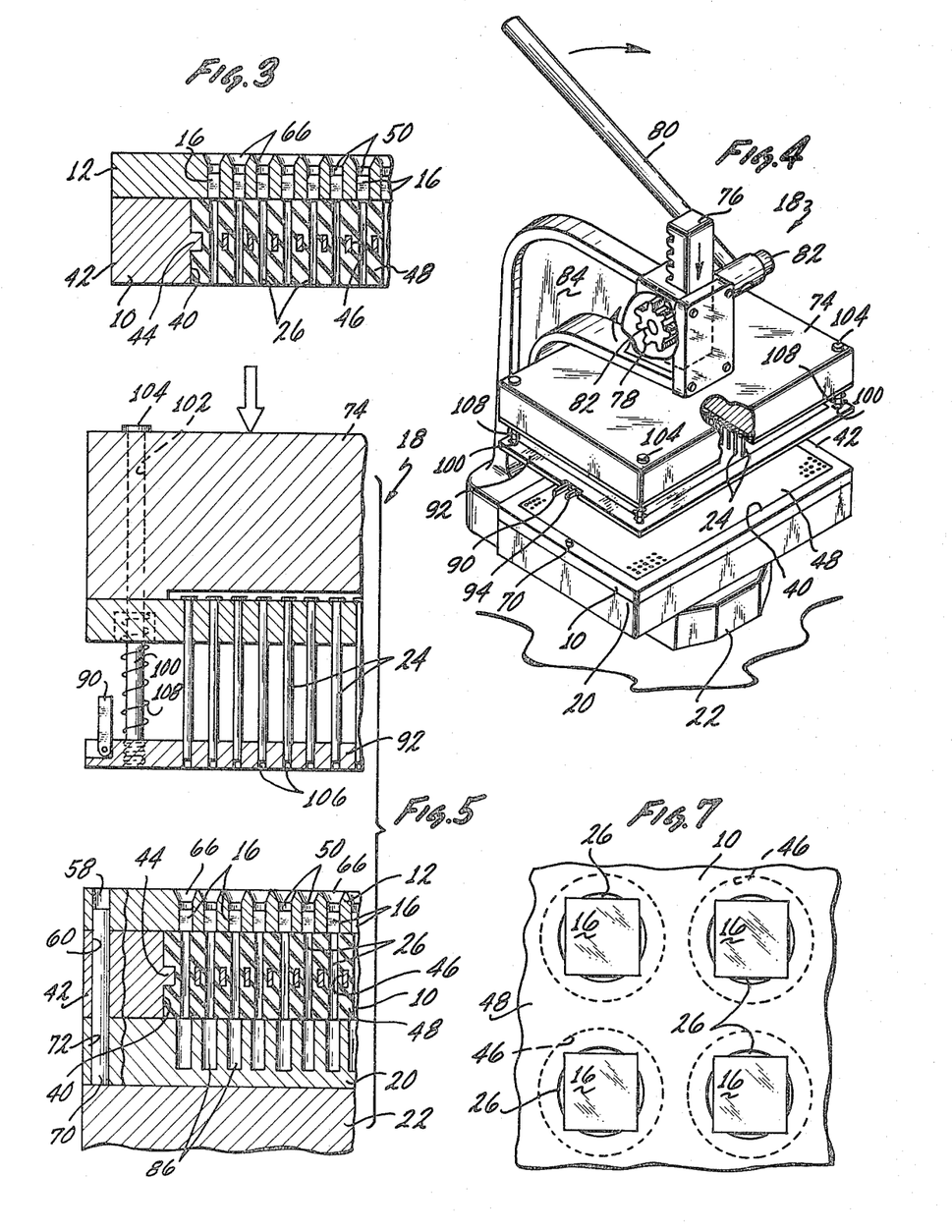
FIG. 3 is a partial vertical sectional view.
FIG. 4 is a perspective view. Certain structure is broken away to reveal structure otherwise hidden.
FIG. 5 is a partial vertical sectional view.
FIG. 7 is an enlarged, fragmentary plan view.

The drawings show sequence of operations. FIG. 1 includes, from top to bottom, a part handling plate 10, a part loading plate 12, and a part feeding body 14. FIG. 2 adds schematically the functions of vibration, vacuum and spring mount to the FIG. 1 parts to load parts in plate 12. FIG. 3 shows part loading plate 12 and part handling plate 10 with electronic components 16 in place in plate 12.

FIG. 4 shows part punching means 18 used (a) to transfer parts 16 from part loading plate 12 to part handling plate 10, (b) used to transfer parts 16 from one side to the other side of part handling plate 10, and used to unload parts 16 from part handling plate 10.

FIG. 5 shows a step in the sequence of operations involving part pushing means 18. A bank of pushers 24 is shown in the upper part of the view, and plates 10, 12, a part unloading plate 20, and part pushing base 22 are shown in the lower part of the view. FIG. 6 is like FIG. 5 but with the pushers 24 of part pushing means 18 in the process of pushing parts 16 out of part loading plate 12 and into part handling plate 10. The ends of parts 16 are exposed above the upper face of plate 10.

The method of handling parts 16 shown involves resiliently gripping parts in the part receiving passageways 26 in part handling plate 10. FIG. 7 illustrates resilient gripping of parts. Parts 16 usually are right-rectangular (square or rectangular cross-section) whereas passageways 26 are round and normally have a diameter less than the maximum cross-sectional dimension of parts 16. The walls of passageways 26 are resiliently coated to accommodate and grip parts 16.

FIG. 8 shows equipment for processing a part handling plate 10 having the ends of electronic components 16 exposed above its upper face. The equipment includes conveying means 28, part coating equipment 30, and part heating equipment 32, used to coat ends of parts 16 and to bake such coatings. FIG. 9 shows coating 34 applied to a first end of a part 16.

Figure 11:
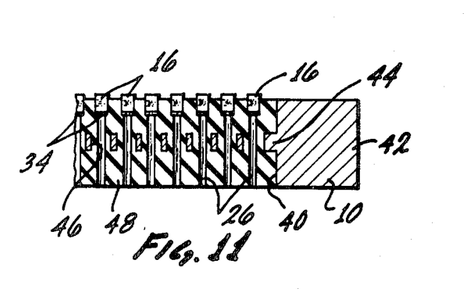
FIG. 11 is a fragmentary vertical section showing an inverted part handling plate.

FIG. 10 is like FIG. 6 but with part handling plate 10 inverted, after applying coating 34 and returning plate 10 to part pushing press 18. Parts 16 are being moved by pushers 24 into position exposing their second ends beyond the second face of plate 10, so that the second ends can be coated. FIG. 11 shows plate 10 inverted from its FIG. 10 position with the second ends of the parts 16 exposed, ready to run through the FIG. 8 coating equipment.

Figure 12:
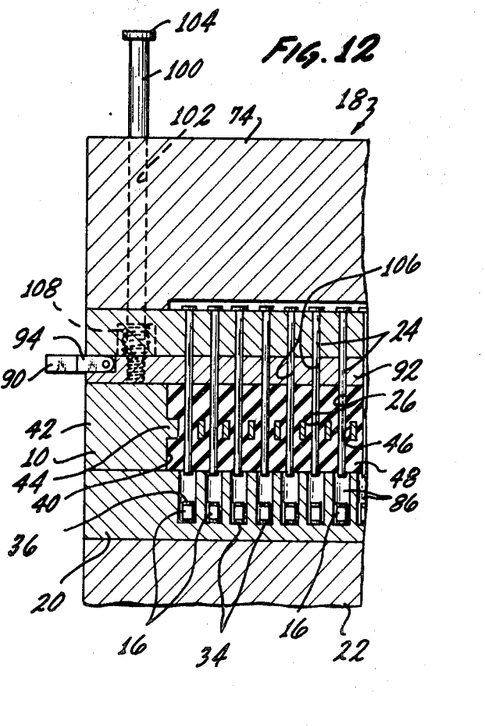
FIG. 12 is a view like FIGS. 5, 6 and 10 but with some parts in different positions.
Figure 13:
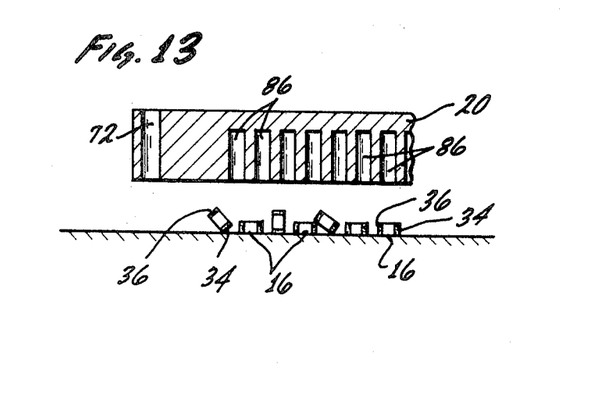
FIG. 13 is a partial sectional view of parts being unloaded from a part unloading plate.

FIG. 12 shows part pushing press 18 in the process of unloading parts from plate 10 into part unloading plate 20. FIG. 13 shows parts 16 being dumped out of plate 20. FIG. 14 shows part 16 with a coating 36 on its second end in addition to coating 34 on its first end.

In the class of miniature electronic components needing conductive coatings to be applied to their ends, probably about 95% of those produced by component manufacturers are 0.500" to 0.200" in length (a little more than 3/64" to a little more than 3/16"). Although some longer parts are produced, at present only that range of lengths are processed on the equipment disclosed herein. Plates 10 presently produced are about 0.350" (⅜" is 0.375"). It is preferred that the length of each passageway will be at least 150% of the maximum length of parts to be handled therein. Reasons to fabricate plates 10 of at least about that thickness include (a) to provide sufficient strength, including sufficient strength of the central web 44 and (b) to be able to accomodate most lengths of parts 16. Parts 16 are continuously gripped by resilient walls in passageways 26 in plate 10 as they are moved to a first position exposing one end of parts 16 for coating and to a second position exposing the opposite end of parts 16 for coating and as they are unloaded. The resilient coating of the walls of passageways 26 extends from face to face of plate 10.

The foregoing description describes some of the principal operations and equipment involved in my invention. I will now review them in more detail.

A basic part of my processing system is part handling plate 10. It has a multiplicity of part receiving passageways 26 having walls uniformly and continuously coated from face to face of plate 10 with resilient material. I will now describe my preferred structure of plate 10. It is formed of metal with a recess 40 in each face extending throughout the major portions of the face to the marginal areas 42. This leaves a central web 44 of metal which has a multiplicity of bores 46. A resilient plastic material 48 is used to fill recesses 40 and bores 46 except for leaving part receiving passageways 26. Material 48 provides resilient walls for passageways 26, to receive and grip parts in the manner particularly illustrated in FIG. 7. The material 48 can be selected from various applicable plastics or rubbers. An example is a pliable silicone rubber. Those skilled in the art will understand the selection of applicable materials and methods, tooling etc., to form plate 10. In the claims when material 48 is described as "resilient plastic" that term is defined to include plastics or natural or artificial rubbers which are suitable for the usage. The purpose of having recesses 40 (rather than merely to coat bores 46) is to better hold the plastic material 48 in place.

Parts 16 usually will be square or rectangular in cross-section. Even if the parts 16 were circular in cross-section, the action of the walls of passageways 26 in gripping parts 16 would be similar. If circular, the diameter of each passageways 26 should be less than the maximum lateral dimension of parts 16 or if passageway 26 is rectangular in cross-section a dimension of passageway 26 such as its width should be less than the corresponding minimum dimension of part 16, such as the width of a rectangular part in order to continuously resiliently grip part 16 in all positions in passageway 26 whether part 16 protrudes from an end of passageway 26 or whether part 16 is centered or otherwise completely contained in passageway 26.

The basic method of handling parts 16 in passageways 26 consists of (a) inserting the parts into the passageways, (b) moving the parts so first ends are exposed beyond the face of plate 10, i.e., FIGS. 6 and 8, and (c) moving parts 16 so the second ends are exposed beyond the second face of plate 10, i.e., FIGS. 10 and 11. The exposed ends of parts 16 are coated by the equipment shown in FIG. 8 after steps (b) and (c) above.

I will now deal with the insertion of parts 16 into passageways 26 of part handling plate 10. The part loading plate 12 and the part feeding body 14 and the use of vibration and vacuum to insert parts 16 in the holes 50 of plate 12 follow practices used before in the prior art. Somewhat similar equipment and processes are utilized in some of the patents identified in the earlier part of this specification.

Part receiving body 14 has a hopper cavity 52 which receives the electronic components 16 in bulk. An open face 54 of cavity 52 is covered by part loading plate 12 and part handling plate 10 that are oriented by alignment pins 56 on body 14 which extend through alignment openings 58, 60 in plates 12, 10 respectively. Components 16 are loaded in cavity in the manner demonstrated in FIG. 1. Then the assembly is inverted as shown in FIG. 2. As the application of vibration and vacuum 62 to a vibrator base 63 and the use of suitable spring mounts 64 for base 63 are old and familiar expedients in the art to load parts in a plate like part loading plate 12, I will only observe that vacuum is applied to the lower ends of passageways 26 to help fill holes 50 in plate 12 with parts 16 as the assembly is being vibrated. Following common practices, holes 50 are slightly larger than parts 16 but not so large that they will fit in any way but with their longitudinal axis vertical, so that they will be presented in end-forward directions to passageways 26. The upper ends 66 of holes 50 are flared to more readily receive parts 16. Holes 50 could be circular or rectangular in cross-section as the only orientation required of parts 16 is that they be presented in an end-forward direction. The action of filling holes will be slightly faster if holes 50 are circular in cross-section. To give an example, in one sized load plate 12 2135 holes 50 were 100% filled with parts 16 in 8-10 seconds. In a larger size, there were 4233 holes 50.

Part pushing means 18 is a form of press and includes a base 22 having upstanding alignment pins 70 that fit into alignment openings 72 in part unloading plate 20, into alignment openings 60 in part handling plate 10 and into alignment openings 58 in part loading plate 12 to hold the plates in proper alignment.

The upper parts of press 18 include an upper plate 74, a rach 76 upstanding from plate 74, a pinion 78 engaged with rack 76, and a pivotally mounted handle 80 secured to a common shaft 82 with pinion 78 and rotating pinion 78 when handle 80 is manually pivoted to force upper plate 74 up and down. The bearing for shaft 82 is supported by an arm 84 upstanding from base 22. Other standards can be substituted for arm 84 and cams or an air cylinder can be substituted for rack and pinion 76, 78 to close press 18.

Suitably mounted on upper press plate 74 in depending position is a bank of pin pushers 24 mating with openings 50 in part loading plate 12, mating with passageways 26 in part handling plate 10, and mating with a multiplicity of recesses 86 in part unloading plate 20. As handle 80 is operated, parts 16 are forced from positions in holes 50 of plate 12 into passageways 26 in plate 10. The first position of parts 16 in passageways 26 is shown in the sequence of FIGS. 5-6 to leave the upper ends of parts 16 in a plane above the upper face of plate 10 so that they can be coated. Stop 90 pivotally mounted on stripper plate 92 can be positioned upright to stop upper plate 74 when pins 24 have so oriented the ends of parts 16 in the FIG. 6 position.

The second position of parts 16 in passageways 26 is shown in FIG. 10 with the second ends of parts 16 disposed in a plane below the lower face of plate 10 in position to be coated. A second stop 94 pivotally mounted on stripper plate 92 can be positioned in upright position to stop upper press plate 74 when the FIG. 10 position of the ends of parts 16 is reached. Two FIG. 10 type operations can be substituted for a FIG. 6 and a FIG. 10 type operation, i.e., if a FIG. 10 operation is conducted and then the plate 10 is inverted and the operation repeated, both ends of parts will have been disposed in position to be coated.

An assortment of shims can be substituted for the pivoted stops 90, 94. Such shims would be interposed between stripper plate 92 and upper press plate 74.

Stripper plate 92 is supported on upper press plate 74 by rods 100 slidably mounted in openings 102 in plate 74 and secured to stripper plate 92. The enlarged ends 104 of rods 100 act as abutments limiting downward movement of stripper plate 92 relative to upper press plate 74 to a position preferably covering the lower ends of pins 24, as in FIG. 5. Plate 92 has openings 106 mating with pins 24. Compression springs 108 on rods 100 between upper press plate 74 and stripper plate 92 normally urge stripper plate 92 to the FIG. 5 lower position covering pins 24. The purposes of stripper plate 92 include (a) to normally cover and protect pin pushers 24 during insertion and removal of plates 10, 12, 20, and (b) to strip part handling plate 10 from the bank of pins 24 when the press 18 is opening, as otherwise the resilient walls of passageways 26 may grip pins 24 and plate 10 may therefor tend to raise with upper press plate 74.

Part handling plate 10 is removed from press 18 after the FIGS. 5-6 sequence to apply coating 34 to the first end of electronic components 16, and after the FIG. 10 operation to apply coating 36 to the second ends of components 16 exposed as illustrated in FIG. 11. The equipment shown in FIG. 8 demonstrates state-of-the-art coating equipment 30 and ovens 32, so I have shown the equipment schematically.

Plate 10 is shown schematically to be mounted on a travelling platform 109 having upstanding pins 110 fitting in alignment holes 60 in plate 10 to secure it in position. The conveying means 112 (implicitly a screw mechanism) actually would not be common to both coating station 30 and oven 32, i.e., the ends of parts 16 first would be coated and then the plate 10 would be plated on a conveyor of an oven.

As indicated, the coating mechanism 30 is of a common type having a metal roller 120, usually having a doctor blade (not shown) controlling the amount of coating passing onto roller 120 and then onto the ends of parts 16, and having a reservoir function 122 in supplying the coating material to the roller/doctor blade mechanism.

I will not further describe the coating and baking functions in applying conductive metalized coatings 34, 36 to the ends of capacitors or resistors 16. The type of coating will follow state-of-the-art materials such as a fine milled silver compound in a resin base cured by heating in an oven.

My process of orienting the parts for processing by the equipment respresented in FIG. 8 represents high efficiency in time consumed. Using the equipment shown in FIGS. 1 and 2, the example of time given before is inserting about 2000 or about 4000 parts 16 in openings 50 in part loading plate 12 in about eight to ten seconds. In the process of the FIGS. 5-6 operation getting ready to coat the parts with the FIG. 8 equipment, an example is about ten seconds. To orient parts 16 in press 18 the second time (FIG. 10), again would involve around ten seconds. Silvering the first or second ends of parts 16 can be accomplished in about ten seconds. Curing the coating in an oven may vary between about two and a half minutes and five minutes, depending on the type of silver or other compound used to coat the ends of parts 16. After coating and firing, inspection can be accomplished merely by glancing at plate 10, as any uncoated ends of parts 16 would be quite evident. However, it is rare to have an uncoated part 16.

Unloading of parts 16 from passageways 26 of plate 10 into recesses 86 in unloading plate 20, as demonstrated in FIG. 12, is another ten second type operation. FIG. 13 indicates unloading of plate 20.

The claims of this application include a plate 10 supporting a number of miniature electronic parts 16 in a multiplicity of passageways 26 extending from face to face of body 10. Each passageway 26 has resilient walls and each has a dimension smaller than the corresponding dimension of each part 16 so that when the parts 16 are forced into passageways 26 they are resiliently gripped.

Figure 15:
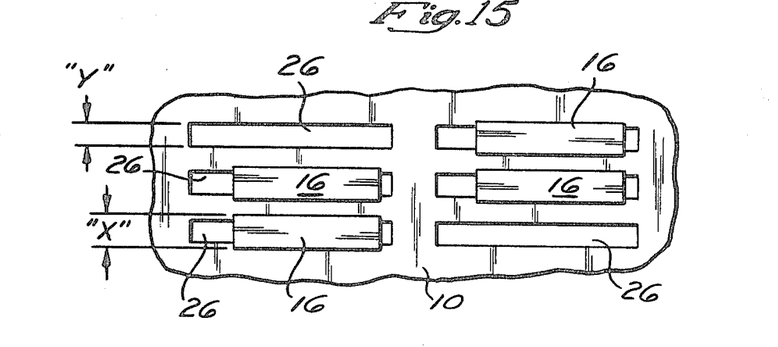
FIG. 15 is like FIG. 7 only showing rectangular configurations of parts and passageways.
Figure 16:
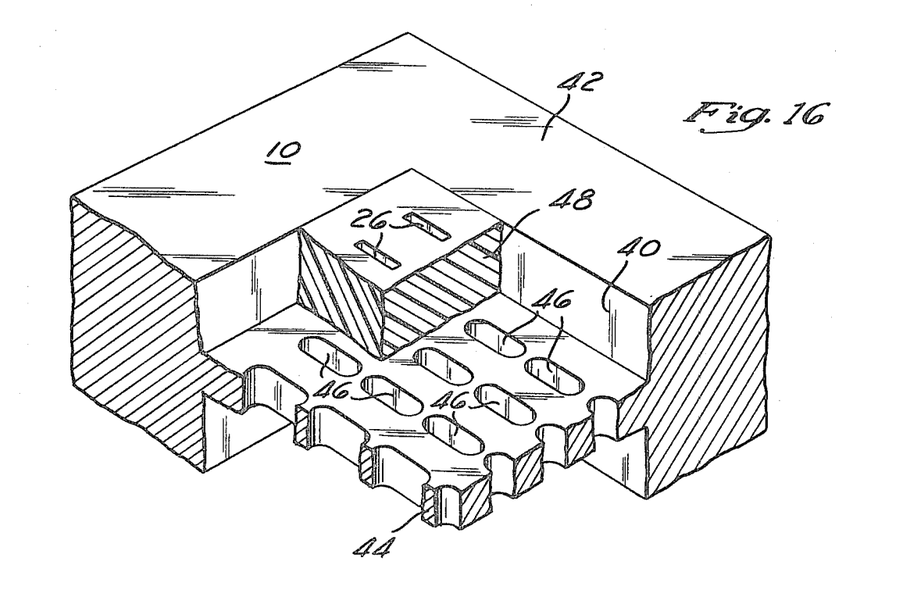
FIG. 16 is a fragmentary perspective view, partly in section, further showing the rectangular configuration of FIG. 15.
Figure 17:
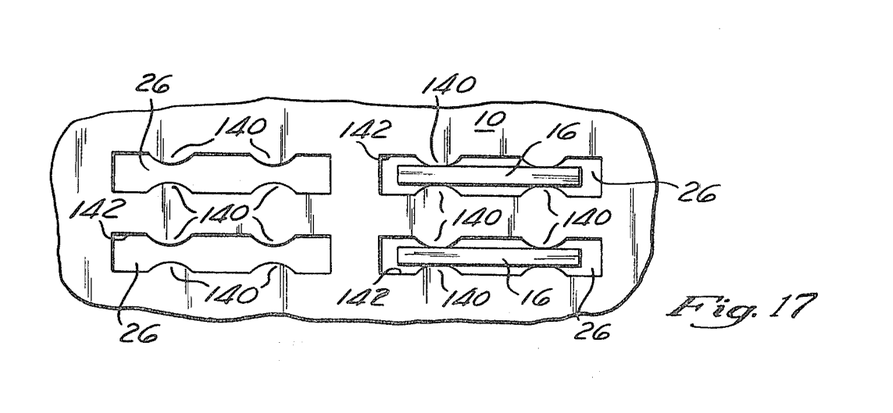
FIG. 17 is like FIG. 15 only showing passageway walls with bosses or teeth.

Passageways 26 are shown in FIG. 7 to be circular in cross-section but may have other cross-sections as long as each passageway 26 has a dimension smaller than a corresponding dimension of an associated part 16 so that the part 16 is resiliently gripped, as indicated in FIGS. 15, 16, and 17. FIG. 15 is like FIG. 7 but along with FIG. 16, indicates bores 46 of rectangular cross-sections, passageways 26 of rectangular cross-sections and parts 16 of rectangular cross-sections, in which the minor cross-sections "Y" of the passageway is somewhat less than the minimum cross-section "X" of the parts 16 (according to the tolerances of parts 16) so that each part 16 is gripped at least across its minor axis by the associated passageway 26. My prior, copending patent application Ser. No. 06/195,347, filed 10/9/80, in Art Unit 162, entitled "Means and Method for Processing Miniature Electronic Components," shows passageways and parts of rectangular cross-sections.

FIG. 17 shows modified rectangular passageway cross-sections which are like those in FIGS. 15 and 16 except the minimum distances across the minor axes of the passageways 26 are defined by the distances between bosses or teeth 140 protruding beyond the normal sidewalls 142 of passageways 26. The parts 16 are gripped by one or more pairs of teeth 140 extending from the sides of passageways 26. In the configuration shown, two pairs of bosses are shown. In another configuration used, one pair was used, etc. The idea of the toothed or notched construction is to minimize the amount of resilient material in the walls of passageways 26 that must be displaced to force the parts into the gripping passageways. This can be a particularly desirable construction when the difference in cross-sectional widths of a part is relatively great according the the minimum and maximum tolerances of the part so that if the sides of passageway 26 are to grip a part 16 of minimum width, then a lot of resilient wall material must be displaced for a part 16 of maximum width. Obviously, the amount of wall material to be displaced is smaller with a toothed wall. Note also in these rectangular constructions of FIGS. 15, 16 and 17 that the cross-sectional lengths of passageways 26 can be greater than the cross-sectional lengths of parts 16, so that there is room to turn a part 16 in a passageway 26 if needed. My prior application Ser. No. 06/195,347 describes turning of parts 16 in passageways 26. The widths of passageways may be somewhat narrower than depicted in FIGS. 15–17 but the widths have been exaggerated for clarity of illustration.

Having thus described my invention, I do not want to be understood as limiting myself to the exact details described. Instead, I wish to cover those modifications of my invention that will occur to those skilled in the art upon learning of my invention and which properly fall within the scope of my invention.

I claim:

1. The process of coating ends of a multiplicity of like miniature electronic parts such as capacitors, resistors or the like, comprising:
   (a) forming a body with a multiplicity of juxtaposed parallel passageways extending from face to face of said body,
   (b) forming said passageways with resilient walls substantially from end to end of said passageways,
   (c) sizing said passageways so that at least one cross-sectional dimension in each passageway is shorter than the corresponding cross-sectional dimension of the parts,
   (d) first disposing said parts in a bank juxtaposed to one another and each aligned with one said passgeways and loading the parts by pushing said parts together in a bank into said passageways until their first ends are exposed at a first face of said body,
   (e) coating the exposed first ends of said parts and curing the coating thereon,
   (f) second pushing all of said parts together in a bank in said passageways until their second ends are exposed at a second face of said body,
   (g) coating the exposed second ends of said parts and curing the coating thereon,
   (h) continuously resiliently gripping the sides of said parts in all positions in said passageways whether protruding from either end of said passageways or whether inbetween,
   (i) pushing said parts together in a bank out of said passageways to unload the parts, and
   (j) the lengths of said passageways being greater than the lengths of said parts to be coated and the second pushing step occurring only after the first coating step.

2. In the process of claim 1, pushing said parts in said passageways by using a bank of juxtaposed pushers secured together to move as a bank.

3. In the process of claim 2, stripping said passageways from said pushers after inserting said pushers in said passageways to push said parts.

4. In the process of claim 2, stopping said bank of pushers in one position to dispose said parts with their first ends exposed and stopping said bank of pushers in a second position to dispose said parts with their second ends exposed and not stopping said bank of pushers in said first and second positions thereof in pushing said parts to unload the same.

5. The process of coating ends of a multiplicity of like miniature electronic parts such as capacitors, resistors or the like, comprising:
   (a) forming a multiplicity of juxtaposed parallel passageways,
   (b) first disposing said parts in a bank juxtaposed to one another and each aligned with one of said passageways and loading the parts by pushing said parts together in a bank into said passageways until their first ends are exposed at a first end of said passageways while continuously resiliently gripping the sides of said parts,
   (c) coating the exposed first ends of said parts,
   (d) second pushing said parts together in a bank in said passageways until their second ends are exposed at a second end of said passageways while continuously resiliently gripping the sides of said parts,
   (e) coating the exposed second ends of said parts, and
   (f) the lengths of said passageways being greater than the lengths of said parts to be coated and the second pushing step occurring only after the first coating step.

6. The process of coating ends of a multiplicity of like miniature electronic parts such as capacitors, resistors or the like, comprising:
   (a) forming a multiplicity of juxtaposed parallel passageways,
   (b) first loading the parts into said passageways by pushing said parts into said passageways until their first ends are exposed at a first end of said passageways while continuously gripping the sides of said parts,
   (c) coating the exposed first ends of said parts,
   (d) second pushing said parts in said passageways until their second ends are exposed at a second end of said passageways while continuously gripping the sides of said parts,
   (e) coating the exposed second ends of said parts, and
   (f) the lengths of said passageways being greater than the lengths of said parts to be coated and the second pushing step occurring only after the first coating step.

7. In the process of claim 6, forming the parts with square cross-sections and forming the passageways with circular cross-sections and with resilent walls and gripping the sides of the parts by gripping opposite corners of the square cross-sections.

8. In the process of claim 6, forming the parts and passageways with cross-sections in the forms of elongated rectangles and making the widths of the cross-sections of the passageways shorter than the widths of the cross-sections of the parts and forming said passageways with resilient walls and gripping the sides of said parts by gripping the long sides of the part elongated rectangular cross-sections.

9. In the process of claim 8, forming the minimum widths of the elongated rectangular passageway cross-sections by forming opposed bosses whereby a part made to maximum tolerances will not displace as much resilient material as would be the case if bosses were not used to define the minimum passageway widths.

10. In the method of claim 1, forming said passageways with lengths at least one hundred and fifty percent of the lengths of said parts.

* * * * *